(12) United States Patent
Xu et al.

(10) Patent No.: US 8,658,526 B2
(45) Date of Patent: *Feb. 25, 2014

(54) METHODS FOR INCREASED ARRAY FEATURE DENSITY

(71) Applicant: SanDisk 3D LLC, Milpitas, CA (US)

(72) Inventors: Huiwen Xu, Sunnyvale, CA (US);
Yung-Tin Chen, Santa Clara, CA (US);
Steven J. Radigan, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/760,877

(22) Filed: Feb. 6, 2013

(65) Prior Publication Data

US 2013/0183829 A1    Jul. 18, 2013

Related U.S. Application Data

(63) Continuation of application No. 13/366,916, filed on Feb. 6, 2012, now Pat. No. 8,372,740, which is a continuation of application No. 12/754,602, filed on Apr. 5, 2010, now Pat. No. 8,114,765, which is a continuation-in-part of application No. 12/318,609, filed on Dec. 31, 2008, now Pat. No. 8,084,347.

(60) Provisional application No. 61/260,813, filed on Nov. 12, 2009.

(51) Int. Cl.
*H01L 21/44* (2006.01)

(52) U.S. Cl.
USPC ........... 438/592; 438/587; 438/598; 438/642; 438/669; 438/671; 257/E21.668

(58) Field of Classification Search
None
See application file for complete search history.

(56) References Cited

U.S. PATENT DOCUMENTS

| | | |
|---|---|---|
| 5,141,817 A | 8/1992 | Babich et al. |
| 5,198,386 A | 3/1993 | Gonzalez |
| 5,236,853 A | 8/1993 | Hsue |
| 5,266,512 A | 11/1993 | Kirsch |
| 5,290,723 A | 3/1994 | Tani et al. |
| 5,310,693 A | 5/1994 | Hsue |
| 5,429,988 A | 7/1995 | Huang et al. |
| 5,510,286 A | 4/1996 | Kim |
| 5,766,998 A | 6/1998 | Tseng |
| 5,915,167 A | 6/1999 | Leedy |
| 5,916,821 A | 6/1999 | Kerber |
| 5,977,638 A | 11/1999 | Rodgers et al. |

(Continued)

FOREIGN PATENT DOCUMENTS

| | | |
|---|---|---|
| JP | S56-137651 | 10/1981 |
| JP | S58-100441 | 6/1983 |

(Continued)

OTHER PUBLICATIONS

Chen et al., U.S. Appl. No. 12/318,590, filed Dec. 31, 2008.

(Continued)

*Primary Examiner* — Kyoung Lee
(74) *Attorney, Agent, or Firm* — Dugan & Dugan, PC

(57) ABSTRACT

A method is provided that includes forming completely distinct first features above a substrate, forming sidewall spacers on the first features, filling spaces between adjacent sidewall spacers with filler features, and removing the sidewall spacers. Numerous other aspects are provided.

22 Claims, 9 Drawing Sheets

(56) References Cited

U.S. PATENT DOCUMENTS

| | | | |
|---|---|---|---|
| 6,055,180 | A | 4/2000 | Gudesen et al. |
| 6,239,008 | B1 | 5/2001 | Yu et al. |
| 6,362,057 | B1 | 3/2002 | Taylor |
| 6,420,231 | B1 | 7/2002 | Harari et al. |
| 6,429,123 | B1 | 8/2002 | Tseng |
| 6,436,816 | B1 | 8/2002 | Lee et al. |
| 6,706,571 | B1 | 3/2004 | Yu |
| 6,853,049 | B2 | 2/2005 | Herner |
| 6,893,972 | B2 | 5/2005 | Rottstegge |
| 6,946,719 | B2 | 9/2005 | Petti et al. |
| 6,952,030 | B2 | 10/2005 | Herner et al. |
| 7,081,377 | B2 | 7/2006 | Cleeves |
| 7,125,808 | B2 | 10/2006 | Clementi et al. |
| 7,176,064 | B2 | 2/2007 | Herner |
| 7,211,866 | B2 | 5/2007 | Yuan et al |
| 7,786,015 | B2 | 8/2010 | Chen |
| 7,846,756 | B2 | 12/2010 | Yen et al. |
| 8,114,765 | B2 * | 2/2012 | Xu et al. ............... 438/597 |
| 2002/0151180 | A1 | 10/2002 | DeBoer |
| 2004/0245557 | A1 | 12/2004 | Seo et al. |
| 2005/0052915 | A1 | 3/2005 | Herner et al. |
| 2005/0085072 | A1 | 4/2005 | Kim et al. |
| 2005/0226067 | A1 | 10/2005 | Herner et al. |
| 2006/0250836 | A1 | 11/2006 | Herner et al. |
| 2006/0250837 | A1 | 11/2006 | Herner et al. |
| 2006/0273298 | A1 | 12/2006 | Petti |
| 2007/0049035 | A1 | 3/2007 | Tran |
| 2007/0049040 | A1 | 3/2007 | Bai et al. |
| 2007/0072360 | A1 | 3/2007 | Kumar et al. |
| 2007/0114509 | A1 | 5/2007 | Herner |
| 2007/0164309 | A1 | 7/2007 | Kumar et al. |
| 2007/0190762 | A1 | 8/2007 | Van Haren |
| 2007/0215960 | A1 | 9/2007 | Zhu et al. |
| 2008/0013364 | A1 | 1/2008 | Kumar et al. |
| 2008/0076070 | A1 | 3/2008 | Koh |
| 2008/0090419 | A1 | 4/2008 | Koh |
| 2008/0206681 | A1 | 8/2008 | Nolscher |
| 2008/0318169 | A1 | 12/2008 | Taniguchi |
| 2009/0085153 | A1 | 4/2009 | Maxwell |
| 2009/0155962 | A1 | 6/2009 | Petti et al. |
| 2009/0179310 | A1 | 7/2009 | Dunton et al. |
| 2009/0181515 | A1 | 7/2009 | Herner et al. |
| 2009/0227108 | A1 | 9/2009 | Shiu et al. |
| 2009/0258318 | A1 | 10/2009 | Chan |
| 2009/0258501 | A1 | 10/2009 | Chan |
| 2009/0268508 | A1 | 10/2009 | Chen |
| 2009/0269932 | A1 | 10/2009 | Chen et al. |
| 2010/0105210 | A1 | 4/2010 | Chen et al. |
| 2010/0167520 | A1 | 7/2010 | Chen et al. |
| 2010/0193916 | A1 | 8/2010 | Xu et al. |
| 2012/0094478 | A1 | 4/2012 | Chen et al. |
| 2012/0135603 | A1 | 5/2012 | Xu |

FOREIGN PATENT DOCUMENTS

| | | |
|---|---|---|
| JP | H10-144660 | 5/1998 |
| JP | 2006-261307 | 9/2006 |
| JP | 2008-047863 | 2/2008 |
| JP | 2008-536297 | 9/2008 |
| JP | 2008-244417 | 10/2008 |
| JP | 2008-258565 | 10/2008 |
| JP | 2010-123808 | 6/2010 |
| JP | 2010-522991 | 7/2010 |
| WO | WO 2004/001799 | 12/2003 |
| WO | WO 2008/068992 | 6/2008 |
| WO | WO 2008/150430 | 12/2008 |
| WO | WO 2009/088587 | 7/2009 |
| WO | WO 2010/062515 | 6/2010 |

OTHER PUBLICATIONS

Knall, U.S. Appl. No. 09/560,626, filed Apr. 28, 2000.
Chen et al., U.S. Appl. No. 11/864,205, filed Sep. 28, 2007.
Chen et al., U.S. Appl. No. 12/289,396, filed Oct. 27, 2008.
Kim, Ryoung H. et al., "Double Exposure Using 193 nm Negative Tone Photoresist", Optical Microlithography XX, Proc of SPIE, vol. 6520, 65202M, 2007, 8 pgs.
Nakamura, Hiroko et al., "Contact Hole Formation by Multiple Exposure Technique in Ultra-low k1 Lithography", Optical Microlithography XVII, Proceedings of SPIE, vol. 5377, Feb. 24-27, 2004, pp. 255-263.
Nakamura, Hiroko et al., "Low k1 Contact Hole Formation by Double Line and Space Formation Method with Contact Hole Mask and Dipole Illumination", The Japan Society of Applied Physics, vol. 45, No. 6B, 2000, pp. 5409-5417.
International Search Report and Written Opinion of International Application No. PCT/US2009/069711 mailed Jul. 27, 2010.
Office Action of U.S. Appl. No. 12/318,609 mailed Oct. 19, 2010.
Office Action of U.S. Appl. No. 12/754,602 mailed Oct. 28, 2010.
Jan. 19, 2011 Reply to Oct. 19, 2010 Office Action of related U.S. Appl. No. 12/318,609.
Jan. 27, 2011 Reply to Oct. 28, 2010 Office Action of U.S. Appl. No. 12/754,602.
Notice of Allowance of related U.S. Appl. No. 12/318,609 mailed Feb. 22, 2011.
Notice of Allowance of related U.S. Appl. No. 12/318,609 mailed Apr. 11, 2011.
Final Office Action of related U.S. Appl. No. 12/754,602 dated Apr. 15, 2011.
Restriction Requirement of related U.S. Appl. No. 12/289,396 mailed May 11, 2011.
May 17, 2011 Response to Restriction Requirement of related U.S. Appl. No. 12/289,396 mailed May 11, 2011.
International Search Report of International Application No. PCT/US2009/061643 mailed Jun. 3, 2010.
Written Opinion of International Application No. PCT/US2009/061643 mailed Apr. 27, 2011.
Jun. 4, 2011 Reply to Final Office Action of related U.S. Appl. No. 12/754,602 dated Apr. 15, 2011.
Notice of Allowance of related U.S. Appl. No. 12/754,602 dated Jun. 27, 2011.
Notice of Allowance of related U.S. Appl. No. 12/318,609 mailed Jul. 12, 2011.
International Search Report of International Application No. PCT/US2010/038125 mailed Sep. 13, 2010.
Mercha et al., "Grain Boundary Trap Passivation in Polysilicon Thin Film Transistor Investigated by Low Frequency Noise," Thin Solid Films 383 (2001), pp. 303-306.
Chen et al., "Passivation Effect of Poly-Si Thin-Film Transistors with Fluorine-Ion-Implanted Spacers ," IEEE Electron Device Letters, vol. 29, No. 6, Jun. 2008, pp. 603-605.
Kim et al., "Poly-Si TFT Fabricated by Laser-Induced In-Situ Fluorine Passivation and and Laser Doping," IEEE Electron Device Letters, vol. 22, No. 8, Aug. 2001, pp. 396-398.
Aleksandrova et al., "Characteristics of Polysilicon TFTs, Hydrogenated by Ion Implantation of P-Channel," Journal of Optoelectronics & Advanced Materials, vol. 7, No. 1, Feb. 2005, pp. 313-316.
Communication pursuant to Rules 161(1) and 162 (EPC) in related European Patent Application No. 09799471.9 mailed Aug. 5, 2011.
Notice of Allowance of related U.S. Appl. No. 12/318,609 mailed Aug. 23, 2011.
Office Action of related U.S. Appl. No. 12/289,396 mailed Aug. 1, 2011.
Aug. 11, 2011 Response to Office Action of related U.S. Appl. No. 12/289,396 mailed Aug. 1, 2011.
Terminal Disclaimer of related U.S. Appl. No. 12/289,396 filed Aug. 11, 2011.
Notice of Allowance of U.S. Appl. No. 12/754,602 mailed Oct. 11, 2011.
Notice of Allowance of related U.S. Appl. No. 12/289,396 mailed Oct. 25, 2011.
Chen et al., U.S. Appl. No. 13/331,267, filed Dec. 20, 2011.
Xu et al., U.S. Appl. No. 13/366,916, filed Feb. 6, 2012.
Feb. 13, 2012 Response and amended pages to Aug. 5, 2011 Communication pursuant to Rules 161(1) and 162 (EPC) in related European Patent Application No. 09799471.9.

(56) References Cited

OTHER PUBLICATIONS

Office Action of related U.S. Appl. No. 13/331,267 mailed Jun. 6, 2012.
Sep. 5, 2012 Response to Jun. 6, 2012 Office Action of related U.S. Appl. No. 13/331,267.
Notice of Allowance of related U.S. Appl. No. 13/331,267 Sep. 26, 2012.
Notice of Allowance of related U.S. Appl. No. 13/366,916 Oct. 12, 2012.
Notice of Allowance of related U.S. Appl. No. 13/331,267 Nov. 8, 2012.
Invitation pursuant to Article 94(3) and Rule 71(1) EPC related European Patent Application No. 09799471.9 dated Jan. 9, 2013.
Chen et al., U.S. Appl. No. 13/744,971, filed Jan. 18, 2013.
Office Action in related Chinese Patent Application No. 200980153246.X dated Jan. 18, 2013.
Mar. 13, 2013 Reply to Jan. 9, 2013 Invitation pursuant to Article 94(3) and Rule 71(1) EPC related European Patent Application No. 09799471.9.
May 31, 2013 Reply to Jan. 18, 2013 Office Action in related Chinese Patent Application No. 200980153246.X.
Office action of U.S. Appl. No. 13/744,971 mailed May 1, 2013.
Aug. 1, 2013 Response and Terminal Disclaimer to May 1, 2013 Office Action of related U.S. Appl. No. 13/744,971.
Second Office Action in related Chinese Patent Application No. 200980153246.X dated Sep. 11, 2013.
Notice of Allowance of related U.S. Appl. No. 13/744,971 mailed Sep. 27, 2013.
Nov. 21, 2013 Response to Sep. 11, 2013 Second Office Action in related Chinese Patent Application No. 200980153246.X.
Office Action in related Japanese Patent Application No. 2011-543713 dated Oct. 29, 2013.
Notice of Allowance of related U.S. Appl. No. 13/744,971 mailed Dec. 10, 2013.

* cited by examiner

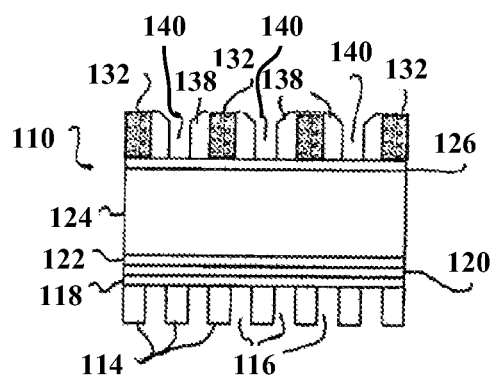 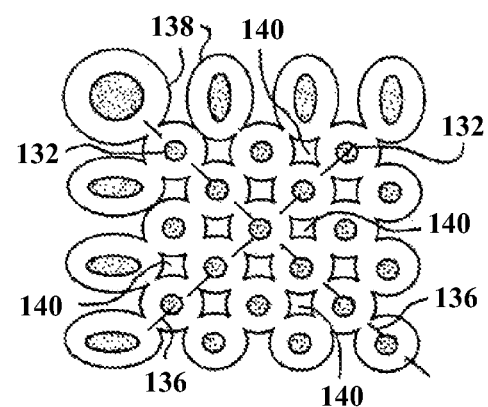
FIG. 7A　　　　　　　　FIG. 7B
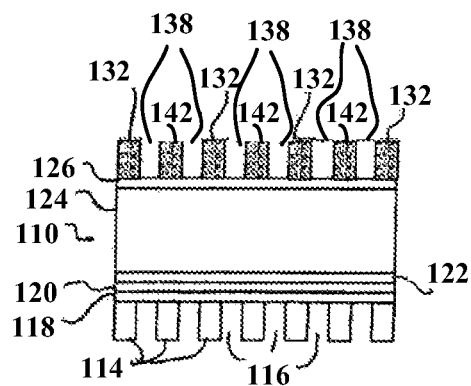 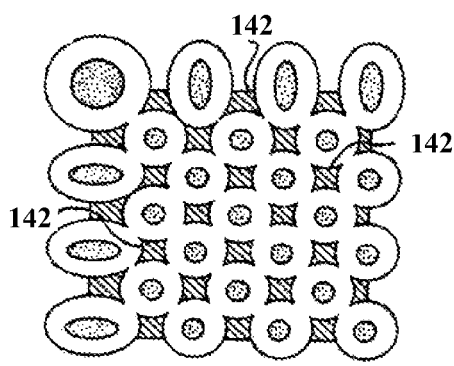
FIG. 8A　　　　　　　　FIG. 8B

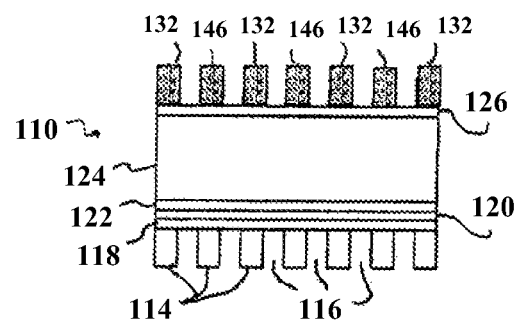 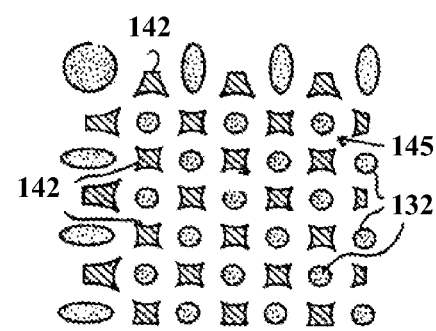
FIG. 9A                    FIG. 9B
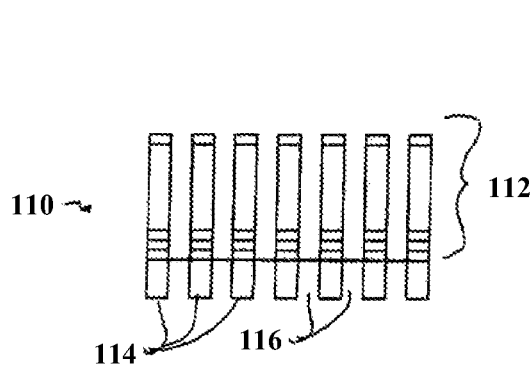 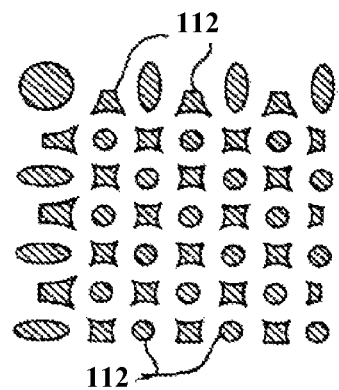
FIG. 10A                   FIG. 10B

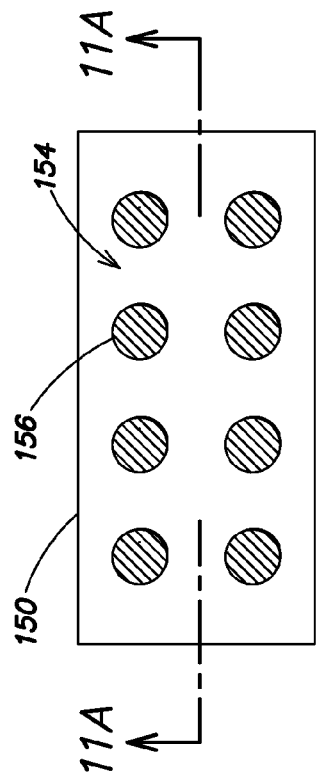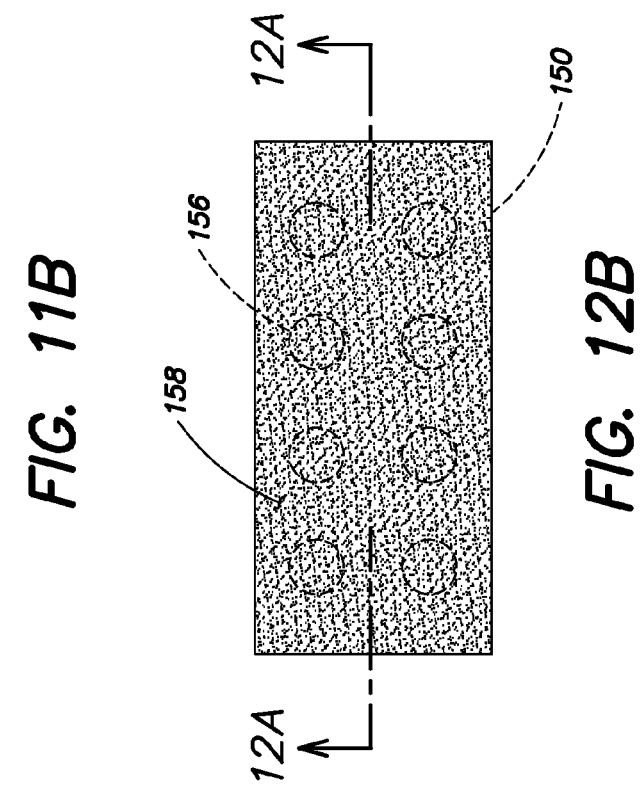
FIG. 11B
FIG. 12B
FIG. 11A
FIG. 12A

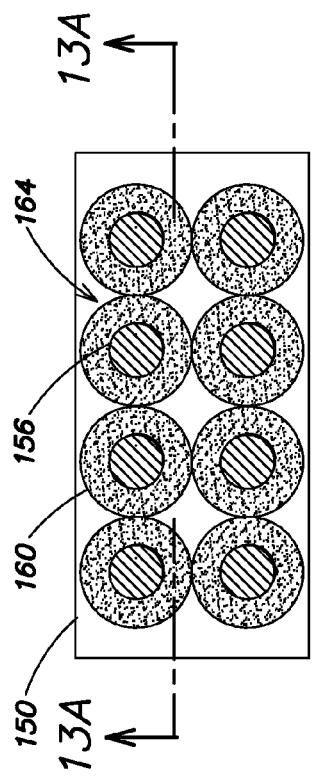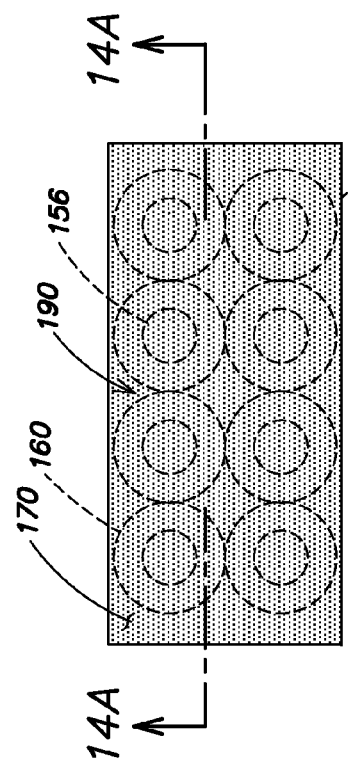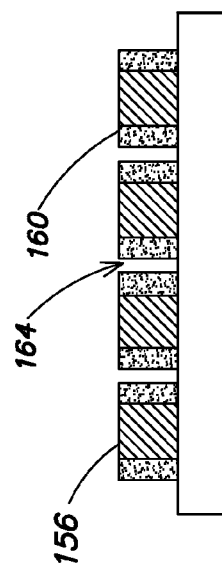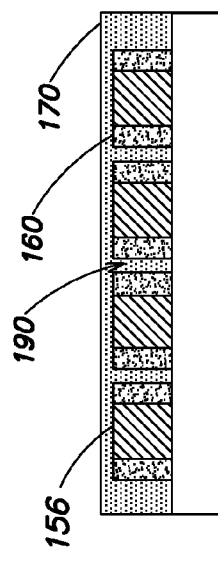

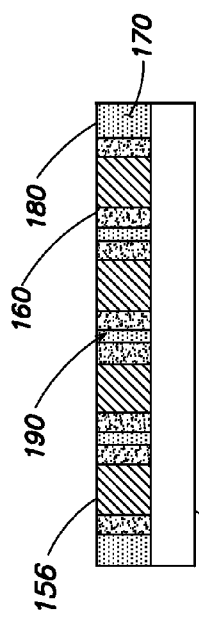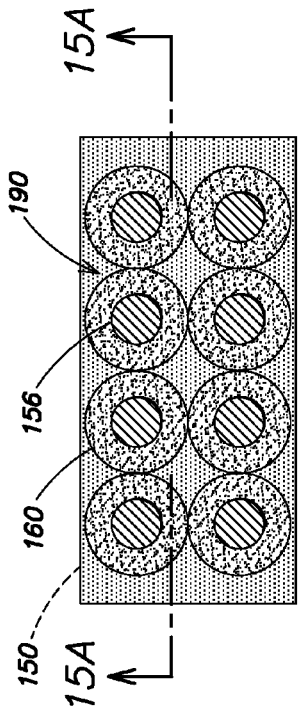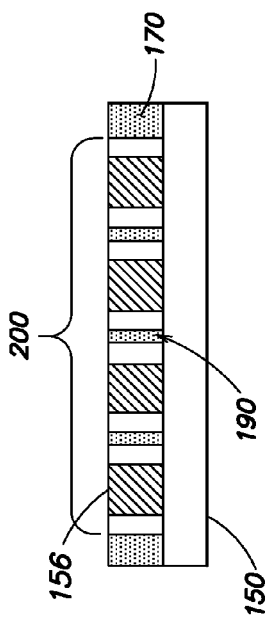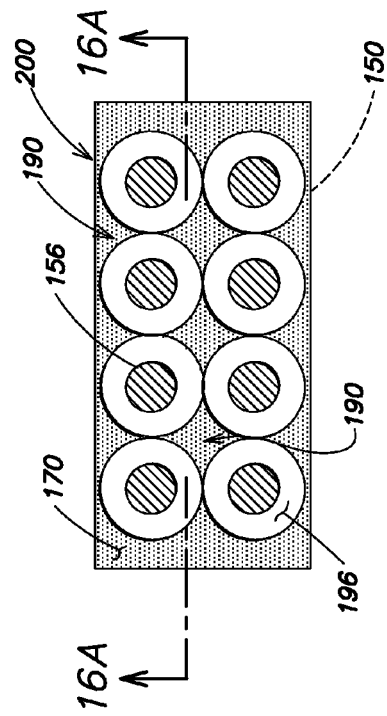

US 8,658,526 B2

METHODS FOR INCREASED ARRAY FEATURE DENSITY

REFERENCE TO RELATED APPLICATIONS

This application is a continuation of U.S. patent application Ser. No. 13/366,916, filed Feb. 6, 2012, now U.S. Pat. No. 8,372,740, which is a continuation of U.S. patent application Ser. No. 12/754,602, filed Apr. 5, 2010, now U.S. Pat. No. 8,114,765, which is a continuation-in-part of U.S. patent application Ser. No. 12/318,609, filed Dec. 31, 2008, now U.S. Pat. No. 8,084,347. This application also claims priority to U.S. Provisional Patent Application Ser. No. 61/260,813, filed Nov. 12, 2009. Each of these applications is hereby incorporated by reference in its entirety for all purposes. All literature and similar materials cited in this application, including but not limited to, patents, patent applications, articles, books, treatises, and internet web pages, regardless of the format of such literature and similar materials, are expressly incorporated by reference in their entirety for any purpose.

BACKGROUND

Various semiconductor materials are used to create memory circuits, electronic devices, and systems. Semiconductor materials are particularly effective since they can be designed, fabricated, and manipulated on small scale. Semiconductor memory circuits are components in these devices which store both data and instructions. Therefore, efforts have focused primarily on trying to maximize the density or efficiency of semiconductor memory circuits while lowering their cost.

A number of tools and techniques are now available for fabricating memory circuits and their associated parts. However, as the dimensions are diminished, so are the tools and methods to make and fabricate these devices.

Fabricating devices smaller than 80 nm requires complicated processes and tools. It is desirable, therefore, to simplify memory devices and methods while at the same time maximizing their feature array density. One such process that attempts to accomplish this objective is the technique of double exposure/double patterning. Another process can be the use of sidewall spacers formed on a template pattern which is then removed. The sidewall spacers are then used as a mask during etching of the underlying film or films.

The above mentioned methods have the effect of dividing the photolithography-produced pitch by two. This provides certain benefits in slightly improving feature array density. However, these techniques have limited applicability and effectiveness for higher order arrays such as two or three-dimensional feature arrays. Further, the above mentioned techniques suffer from the limitation that numerous steps are required to build the memory circuits or devices. In addition, in many cases the required tools and techniques limit the overall materials that can be employed for these feature arrays.

For these reasons, what is needed is a novel method that utilizes semiconductor materials and can improve overall feature array density and quality used for memory circuits and devices. Further these methods and devices must be simple to implement and design and not require complicated processes or tools.

SUMMARY

The embodiments generally relate to methods of making semiconductor devices, and more particularly, to memory circuits, devices and methods for making semiconductor pillar structures and increasing array feature pattern density using selective gap fill. The technique has application to a variety of materials and can be applied to making monolithic two and three-dimensional memory arrays.

The embodiments also provide methods for increasing array density of features having sidewall spacers and spacer regions, comprising filling the spacer regions of the feature array with a selective material to form filler features, and removing the sidewall spacers of the feature array to form filler features in the spacer regions and increase the density of the feature array.

The embodiments also provide methods of making semiconductor devices, comprising patterning a first feature array on a substrate, depositing a first layer on the first feature array, removing a portion of the first layer to form sidewall spacers and spacer regions, filling the spacer regions with a selective material to form filler features, removing a portion of the second layer covering the spacers regions, and removing the sidewall spacers to form a second feature array having features and filler features.

The embodiments also provide semiconductor devices produced by a method for increasing pattern array density of pillars having sidewall spacers and spacer regions, comprising, filling the spacer regions of the array pattern with a selective material, and removing the sidewall spacers of the array pattern pillars to form additional pillars in the spacer regions and increase the density of the pattern array of the semiconductor device.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

FIGS. 6A-6B, 7A-7B, 8A-8B, 9A-9B and 10A-10B are cross-sectional side views (figures with subpart A) and top views (figures with subpart B) of process steps of making a device array according to some embodiments of the teachings.

FIG. 11A shows a cross-sectional view of a first process step of making a device according to some embodiments of the present teachings.

FIG. 11B shows a top view of the process step shown in FIG. 11A.

FIG. 12A shows a cross-sectional view of a second process step of making a device according to some embodiments of the present teachings.

FIG. 12B shows a top view of the second process step shown in FIG. 12A.

FIG. 13A shows a cross-sectional view of a third process step of making a device according to some embodiments of the present teachings.

FIG. 13B shows a top view of the third process step shown in FIG. 13A.

FIG. 14A shows a cross-sectional view of a fourth process step of making a device according to some embodiments of the present teachings.

FIG. 14B shows a top view of the fourth process step shown in FIG. 14A.

FIG. 15A shows a cross-sectional view of a fifth process step of making a device according to some embodiments of the present teachings.

FIG. 15B shows a top view of the fifth process step shown in FIG. 15A.

FIG. 16A shows a cross-sectional view of a sixth process step of making a device according to some embodiments of the present teachings.

FIG. 16B shows a top view of the sixth process step shown in FIG. 16A.

DETAILED DESCRIPTION

Figure 1:
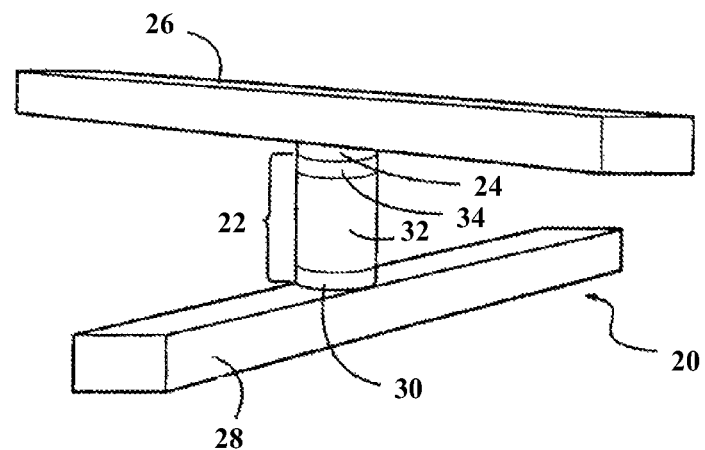
FIG. 1 is a perspective view of a nonvolatile memory cell.

For the purpose of interpreting this specification, the following definitions will apply and whenever appropriate, terms used in the singular will also include the plural and vice versa. In the event that any definition set forth below conflicts with the usage of that word in any other document, including any document incorporated herein by reference, the definition set forth below shall always control for purposes of interpreting this specification and its associated claims unless a contrary meaning is clearly intended (for example in the document where the term is originally used).

The use of "or" means "and/or" unless stated otherwise. The use of "a" herein means "one or more" unless stated otherwise or where the use of "one or more" is clearly inappropriate. The use of "comprise," "comprises," "comprising," "include," "includes," and "including" are interchangeable and not intended to be limiting. Furthermore, where the description of one or more embodiments uses the term "comprising," those skilled in the art would understand that, in some specific instances, the embodiment or embodiments can be alternatively described using the language "consisting essentially of" and/or "consisting of."

In describing and claiming the embodiments, the following terminology will be used with the definitions set out below.

The term "selective material" refers to materials adapted to function as a hard mask material. For instance, carbon, silicon, amorphous silicon or carbon, and tungsten can be employed as hard mask materials. Other known or not known materials having similar functional properties can also be employed.

The term "surface activation technique" or "surface activate," refers to any method or technique adapted to activate a surface for reaction. For instance, plasma enhanced chemical vapor deposition (PECVD) can be used to "surface activate" carbon surfaces by anisotropic bombardment. Other similar techniques and methods are also possible that produce similar surface activations. For instance, other methods that produce ionic surfaces can also be employed.

While the present teachings are described in conjunction with various embodiments, it is not intended that the present teachings be limited to such embodiments. On the contrary, the present teachings encompass various alternatives, modifications, and equivalents, as will be appreciated by those of skill in the art.

The present inventors realized that instead of using sidewall spacers as a mask for etching device layers, the sidewall spacers can instead be used as sacrificial spacers when forming the etching mask. Once the etching mask is formed, the sidewall spacers are removed and portions of the device layers located below the former sidewall spacer locations are removed to leave spaced apart devices, such as pillar shaped devices.

For example, one or more device layers are first formed over a substrate. Any suitable substrate can be used, such as a semiconductor wafer (including silicon or compound semiconductor wafers) or a metal, glass, ceramic or plastic substrate. The substrate can be covered by one or more insulating layers and/or one or more devices, such as driver circuits, can be formed on or in the substrate.

The device layers can comprise semiconductor layers for semiconductor devices, electrically conductive layer or layers which form electrodes, and/or insulating layers for isolation of the semiconductor or conductive portions of the devices.

At least two spaced apart features are then formed over the device layers. A plurality (i.e., more than two) features are formed to form a large device array. The features can be formed directly on or above semiconductor, conductive and/or insulating device layers. The features can have any shape as long as these features can subsequently function as an etching mask for etching the underlying device layers.

For example, as will be described in more detail below, the features can have a cylindrical shape. However, other shapes, such as rectangular or triangular shape can also be used if rectangular or triangular devices are to be formed. The features can have any desired size, and have the same width as the desired width of the underlying devices. The features should have a sufficient height or thickness to act as an etching mask.

The features comprise an imagable material, such as an imagable polymer material, including a photoresist material (including visible and UV imagable photoresist material), an electron beam imagable resist material or a nanoimprint lithography imagable resist material. Thus, by using an imagable material rather than a non-imagable material for the features, a separate etching step used to etch non-imagable features can be omitted. Optionally, a trimming step can be conducted to reduce the size of the spaced apart features. Any suitable trimming method, for example, dry etching, can be used for trimming the spaced apart features.

Sidewall spacers are then formed on the features. Sidewall spacers can be formed by conventional sidewall spacer formation methods, such as by depositing a film over the features and then anisotropically etching the film to leave sidewall spacers on the features. The spacers can be made of a conductive, insulating or semiconductor material different from that of the upper portions of the features.

The sidewall spacer material can be selected i) such that it can be selectively anisotropically etched with dry etch chemistry compared to the material of the spaced apart features; and ii) such that it can be selectively removed (such as isotropically etched) compared to the material of the spaced apart features using a different dry or wet etch chemistry. For example, when the features comprise an imagable material, such as photoresist material, the spacers can be formed from silicon oxide or silicon nitride. Other material combinations can also be used.

Subsequently, the spaces between adjacent spacers located on adjacent features are filled with so-called filler features. The filler features can be formed by forming a filler film or layer over and between the features and the sidewall spacers. The filler film comprises a flowable material and/or can be deposited by liquid phase deposition, such as spin-on coating.

For example, the filler film can comprise any suitable imagable or non-imagable polymer material that has a viscosity of about 1 to about 15 centipoise to render it flowable and can be deposited by liquid phase deposition. The flowable filler material fills the spaces between the spacers and exposes the upper portions of the spaced apart features and the spacers without the need to remove the upper portions of the flowable filler material. The resulting filler features have about the same height as the spaced apart features made of the imagable material. If a non-flowable material is used for the filler film, then an upper portion of the filler film can be removed by etching or polishing to expose upper portions of the sidewall spacers.

The filler film material can comprise the same material as the imagable feature material (i.e., photoresist, e-beam resist or nanoimprint lithography resist) of the spaced apart features or a different material from the imagable material, but which has a similar etch characteristics or etch resistance to that of the imagable material with respect to the spacer material etching medium (i.e., which resists the etching gas or liquid which will be used to etch the spacers to about the same degree as the imagable material). The filler film material should be different from the material of the sidewall spacers so that the sidewall spacers can be selectively etched compared to the spaced apart imagable material features and the filler features.

After the filler features are formed, the sidewall spacers are selectively removed. The step of selectively removing comprises selectively etching the material of the sidewall spacers without substantially removing the original imagable spaced apart feature or filler feature material. The removal can be performed by selective wet etching for example. The removal of the spacers leaves the spaced apart features and the filler features spaced apart from each other.

The spaced apart features and filler features then function as etching mask during the etching of the underlying hard mask and/or device layers. The hard mask and/or device layers can be etched using isotropic or anisotropic etching using the spaced apart features and the filler features as a mask.

Optionally, prior to the step of etching the hard mask and/or device layers, the filler features can be trimmed to reduce their sizes and/or to round their corners. Any suitable trimming method, for example, dry etching, can be used for trimming the filler features. In some embodiments, the spaced apart features can be trimmed during the step of trimming the filler features. The spaced apart features and/or filler features can be removed after etching the hard mask or device layers.

Any suitable devices can be formed. The devices can have a substantially cylindrical and/or substantially rectangular pillar shape, depending on the shape of the features and the filler features, as will be described in more detail below. Non-pillar shaped devices can also be formed. The devices can comprise diodes, transistors, resistors, anti fuse dielectrics, fuses, resistivity-switching materials, capacitors, etc. Logic, volatile memory or nonvolatile memory devices or arrays can be formed.

In a non-limiting embodiment, a plurality of pillar shaped devices which comprise a plurality of diode containing nonvolatile memory cells are formed. Referring to FIG. 1, Herner et al. U.S. Pat. No. 6,952,030, entitled "High-Density Three-Dimensional Memory Cell," hereinafter the "'030 patent" and hereby incorporated by reference, discloses an exemplary nonvolatile memory cell which can be formed by the method of the embodiments of the present teachings.

Memory cell 20 includes a vertically oriented, cylindrical pillar shaped junction diode. The term junction diode is used herein to refer to a semiconductor device with the property of non-ohmic conduction, having two terminal electrodes, and made of semiconducting material which can be p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material can be interposed between the p-type semiconductor material and the n-type semiconductor material.

Diode 22 and an optional antifuse dielectric 24 are interposed between top 26 and bottom 28 conductors or electrodes. Vertically oriented junction diode 22 includes a heavily doped semiconductor region 30 of a first conductivity type (such as n-type), an intermediate region 32 which can be undoped semiconductor material or lightly doped semiconductor material (which will be referred to as an intrinsic region), and a heavily doped semiconductor region 34 of the second conductivity type (such as p-type) to form a p-i-n diode. If desired, the location of the p and n-type regions can be reversed. The semiconductor material of junction diode 22 can be generally silicon, germanium, or an alloy of silicon and/or germanium. Other semiconductor materials can also be used. Junction diode 22 and antifuse dielectric 24 are arranged in series between bottom conductor 28 and top conductor 26, which can be formed of a metal, such as tungsten and/or TiN. Antifuse dielectric 24 can be located above or below diode 22.

The memory cell can comprise a one-time programmable (OTP) or re-writable nonvolatile memory cell. For example, each diode 22 can act as a steering element of a memory cell and another material or layer 24 which acts as a resistivity switching material (i.e., which stores the data) is provided in series with the diode between the conductors.

Specifically, instead of the antifuse dielectric, resistivity switching material 24 can comprise a fuse, polysilicon memory effect material, metal oxide (such as nickel oxide, perovskite materials, etc.), carbon nanotubes, phase change materials, switchable complex metal oxides, conductive bridge elements, or switchable polymers. The resistivity of resistivity switching material 24 can be increased or decreased in response to a forward and/or reverse bias provided between the electrodes or conductors.

Briefly, cell 20 operates as follows. In the initial state, very little current flows through junction diode 22 when a read voltage is applied between top conductor 26 and bottom conductor 28 because antifuse dielectric 24 impedes current flow. The application of a programming voltage between top conductor 26 and bottom conductor 28 causes dielectric breakdown of the antifuse material, permanently forming a conductive path through antifuse 24.

If the diode semiconductor material is initially formed in a high resistivity state, then the semiconductor material of diode 22 can be altered as well, changing it to a lower-resistivity state. After programming, a higher read current flows between top conductor 26 and bottom conductor 28 upon application of a read voltage. In this way, a programmed cell can be distinguished from an unprogrammed cell.

In alternative embodiments, antifuse dielectric 24 can be omitted. Instead, the polycrystalline semiconductor material of diode 22 can be formed in a relatively high-resistivity state, which also tends to impede current flow, as described in Herner et al. U.S. patent application Ser. No. 10/955,549, "Nonvolatile Memory Cell Without a Dielectric Antifuse Having High- and Low-Impedance States," filed Sep. 29, 2004 and hereinafter the "'549 application," and Herner et al. U.S. patent application Ser. No. 11/148,530, "Nonvolatile Memory Cell Operating by Increasing Order in Polycrystalline Semiconductor Material," filed Jun. 8, 2005 and hereinafter the "'530 application," both hereby incorporated by reference. The application of a programming voltage lowers the resistivity state of the diode. Thus, the diode acts as a resistivity switching material in this embodiment.

Figure 2:
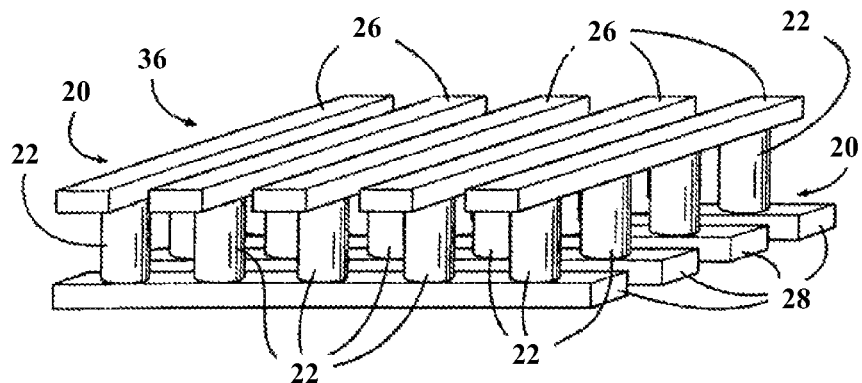
FIG. 2 is a perspective view of an array of memory cells of FIG. 1.

Referring to FIG. 2, a portion of a first memory level 36 of memory cells 20 similar to cell 20 of FIG. 1 is shown. Two, three, four, or more such memory levels, such as eight levels can be formed, stacked one atop the other, to form a monolithic three dimensional memory array, formed above a substrate such as a monocrystalline silicon wafer, and described in the '030 patent and the '549 and '530 applications. Diode pillars 22 have a pitch of less than 100 nm, such as pitch of 78 nm or less and a diameter of 100 nm or less, such as 50 nm or less, such as 32 nm for example.

Bottom electrodes or conductors 28 can be formed either by subtractive or by Damascene methods. In a subtractive method, a conductive layer or film can be patterned into spaced apart electrodes and the gaps between the electrodes are then filled with an insulating material. In a Damascene method, grooves are formed in an insulating material, a conductive layer or film can be formed in the grooves and over the insulating layer, and then the conductive layer or film can be planarized to leave spaced apart electrodes in the grooves.

Figure 3A:
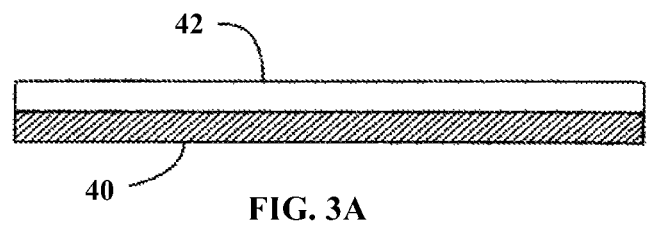
FIGS. 3A-3D are cross-sectional side views illustrating steps in the process of forming conductive rails by a subtractive method.
Figure 3B:
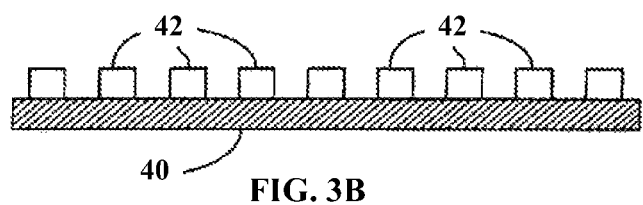
Figure 3C:
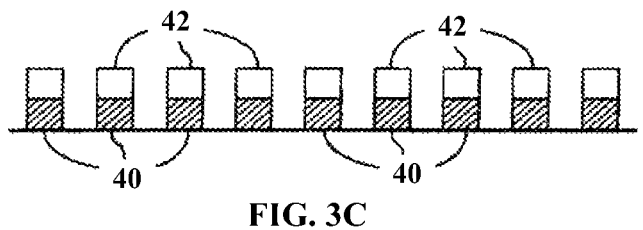
Figure 3D:
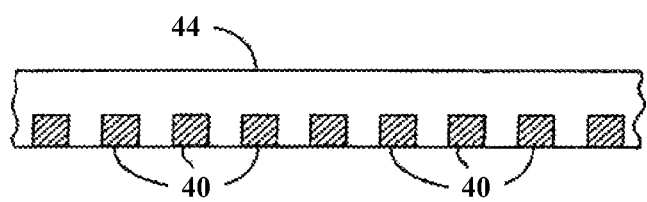

FIGS. 3A-3D illustrate the subtractive method of forming rail-shaped electrodes or conductors 28. As shown in FIG. 3A, one or more conductive layers 40, such as a W and/or a TiN layers are deposited over a substrate, and a layer of photoresist 42 is spun onto it. As shown in FIG. 3B, the layer of photoresist 42 is then photolithographically patterned into the desired form. As shown in FIG. 3C, an etch step removes portions of conductive layer(s) 40 where they are not protected by etched photoresist layer 42. As shown in FIG. 3D, after the etch, photoresist layer 42 can be stripped, leaving conductor or electrode rails 40 behind.

The gaps between rails 40 are filled with an insulating material 44, such as silicon oxide, silicon nitride or other insulating materials. If desired, any overfill of insulating material 44 can be removed, for example by chemical-mechanical polishing (CMP), to expose the upper surface of rails 40 in the planarized surface of insulating layer 44.

Figure 4A:
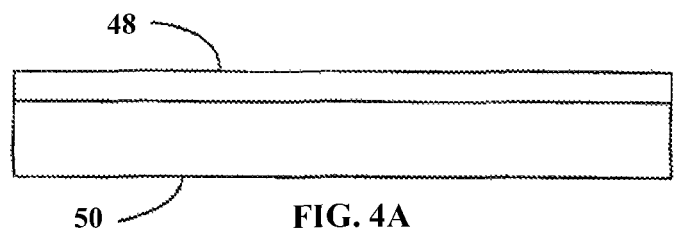
FIGS. 4A-4D are cross-sectional side views illustrating steps in the process of forming conductive rails by a Damascene method.
Figure 4B:
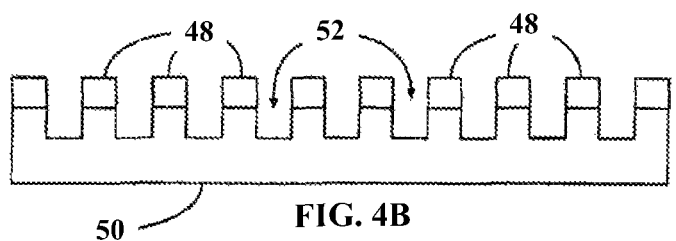
Figure 4C:
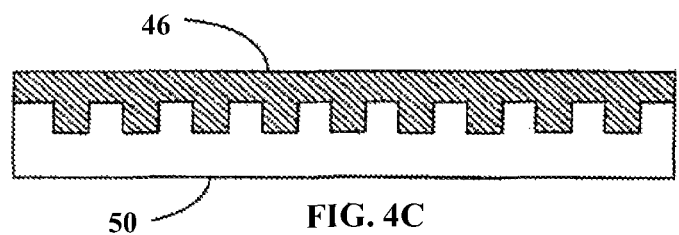
Figure 4D:
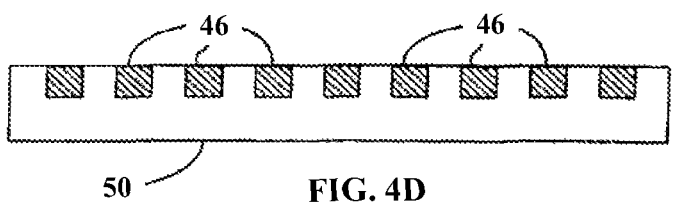

FIGS. 4A-4D illustrate the Damascene method to form electrode or conductor 28. First, a layer of photoresist 48 can be spun onto a deposited insulating layer 50, such as a silicon oxide layer. As shown in FIG. 4B, photoresist layer 48 can be patterned. An etch step then forms grooves or trenches 52 in insulating layer 50. In FIG. 4C, after removal of photoresist layer 48, one or more conductive layers 46, such as a W and/or TiN layers are deposited to fill the grooves or trenches 52. The one or more conductive layers 46 are planarized, for example by CMP or etchback, with the upper surface of the insulating layer to leave the rail shaped conductors in the grooves, as shown in FIG. 4D.

Figure 5:
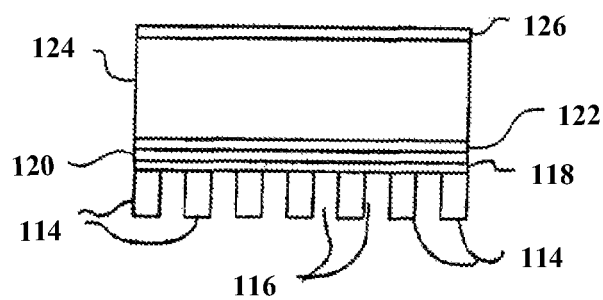
FIG. 5 is a cross-sectional side view of the device layers prior to the formation of the pillar structures.

FIG. 5 shows an initial stage of fabrication of a semiconductor device, such as a pillar shaped nonvolatile memory cell array 110, according to some embodiments of the teachings. Array 110 contains a plurality of bottom electrodes 114 formed by the subtractive or Damascene methods described above with respect to FIG. 3 or 4 respectively. Electrodes 114 correspond to rail shaped conductors 28 shown in FIGS. 1 and 2.

Electrodes 114 can comprise any suitable conductive material, such as tungsten, aluminum, their alloys, etc. Electrodes 114 are separated from each other by an insulating material 116, such as silicon oxide. An optional adhesion layer 118 can be formed above electrodes 114. The adhesion layer can comprise titanium nitride or tungsten nitride.

Optional antifuse dielectric layer 120 can be deposited over the adhesion layer 118. Antifuse dielectric layer 120 can comprise a thin silicon oxide or other insulating layer. Alternatively, another resistivity switching material described above can be substituted from the antifuse dielectric layer. Another optional adhesion layer 122, such a TiN layer, can be deposited over the antifuse dielectric layer 120. Therefore, dielectric layer 120 can be sandwiched between two adhesion layers 118, 122.

One or more semiconductor layers 124, such as silicon or germanium or their alloys are formed over the adhesion layer 122. For example, semiconductor layers 124 can comprise a lower n-type layer, a middle intrinsic layer and an upper p-type layer. The p-type layer can be formed by ion implantation of p-type dopants into the upper part of the intrinsic layer or by deposition of a p-type doped semiconductor layer on the intrinsic layer.

An optional upper hard mask stack 126, can be formed over semiconductor layers 124. The hard mask stack can comprise one or more layers selected from a Bottom Anti-Refection Coating (BARC) layer, a Dielectric Anti-Reflection Coating (DARC) layer (such as a silicon oxynitride layer), an organic hard mask layer, a conductive hard mask layer or layers, or an oxide hard mask layer. The organic hard mask layer can be an amorphous carbon advanced patterning film (APF). For example, stack 126 can comprise a 10 to 20 nm, such as 15 nm TiN layer, a 25 to 75 nm, such as 50 nm W layer, a 100 to 300 nm, such as 200 nm APF layer, a 30 to 50 nm, such as a 40 nm SiON DARC layer, and a 15 to 40 nm, such as 25 nm BARC layer, from bottom to top.

Figure 6A:
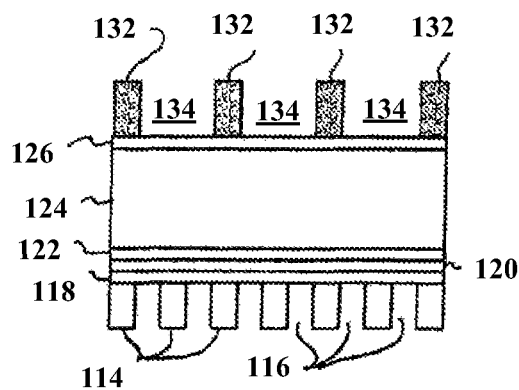
Figure 6B:
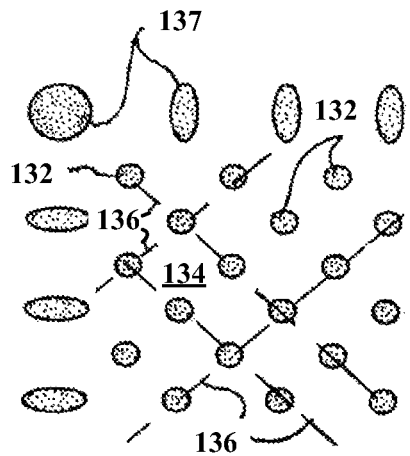

Referring to FIGS. 6A-6B, a first step in the process of creating the pillar devices is shown. FIG. 6A represents a side cross-sectional view of the device layers and FIG. 6B represents a top view of the same after the first step. In the first step, a plurality of features 132 is formed over hard mask stack 126 (or over semiconductor layer 124 if stack 126 is omitted). The features are spaced apart from each other by spaces 134 (in the horizontal and vertical directions as shown in FIG. 6B).

Features 132 are formed by imaging the imagable material by photo, electron beam or nanoimprint lithography, followed by patterning the imaged material into the features 132. Features 132 can be 75 to 200 nm thick, such as 120 to 150 nm thick photoresist features, such as 193 nm radiation sensitive photoresist. Features 132 can optionally be trimmed after formation to reduce their size. If a BARC layer is present on top of hard mask stack 126, then it can be patterned together with features 132 or using features 132 as a mask such that the BARC layer portions are located only under features 132.

Features 132 are arranged along a plurality of imaginary diagonal lines 136 in a rhombus or rotated square type pattern, as shown in FIG. 6B. Only four of the plurality of diagonal lines 136 are shown in FIG. 6B for clarity. As shown in FIG. 6B, features 132 have a substantially cylindrical shape (i.e., they have a circular or near circular (such as oval) cross section).

Alignment edge features 137 are provided adjacent to the device array boundary, as shown in FIG. 6B. The alignment edge features can have a larger size than the plurality of spaced apart features 132 and/or they can have a different shape, such as an oval cross sectional shape. The alignment edge features will be used to simplify alignment in the cut mask step that will be described below.

FIGS. 7A-7B show the next process step. In this step, silicon oxide spacers 138 are formed on each feature 132. It should be noted that if each feature 132 is cylindrical, then it technically has only one sidewall and only one ring or annulus shaped spacer 138 is formed around the sidewall of the feature 132. However, as used herein, the term "spacers" will denote the single annular spacer 138 as well as two or more spacers 138 formed on discrete sidewalls of a polygonal feature 132. Spacers 138 are formed by depositing a silicon oxide layer or film over and between features 132 followed by anisotropic etching of the silicon oxide layer or film.

Oxide spacers 138 fill spaces 134 around features 132 primarily along the plurality of diagonal lines 136, leaving discrete spaces or interstices 140 between adjacent sidewall spacers 138. Due to the annular shape of sidewall spacers 138, the interstices have a rectangular cross sectional shape with concave sidewalls, as shown in FIG. 7B.

FIGS. 8A-8B show the next two steps of the process. A filler film can be formed between and over features 132 and spacers 138. The filler film can comprise an imagable material, for example, a photoresist material, an e-beam resist material, a nanoimprint resist material, or a non-imagable material. The filler film can be deposited by a liquid phase method, such as spin-on or spray coating, to expose the upper surfaces of spacers 138.

The deposition step leaves a plurality of imagable material filler features 142 between sidewall spacers 138. Because filler features 142 fill interstices 140, filler features 142 also have a rectangular or square cross sectional shape with concave sidewalls (i.e., a substantially rectangular or square shape). At this point in the fabrication of the device array, spaces 134 are completely filled with either oxide spacers 138 or filler features 142.

If desired, an optional cut masking and etching step can be performed to remove the filler film or filler features 142 from the area outside of the device array. A photoresist layer can be formed over the plurality of filler features 142 and over the plurality of spaced apart features 132. The photoresist layer can be exposed such that the edges of the exposed areas intersect all of edge features 137. Elongating or enlarging edge features 137 thus allows for an easier alignment of this cut mask.

The remaining filler film or filler features remaining in areas outside of the device array boundary that are not covered by the photoresist pattern are etched away. Alternatively, if the filler film comprises an imagable material, such as a photoresist material, the step of cut masking and etching step made be performed by simply imaging the imagable material (such as for example the exposing the photoresist filler film to radiation) in such a way that the edges of the exposed areas intersect all of edge features 137. If desired, the cut masking and etching step can be performed after the step of removing spacers 138.

FIGS. 9A-9B show the next step in the process. In this step, oxide spacers 138 are selectively etched away leaving features 132 and filler features 142 spaced apart by spaces 145. Spacers 138 can be selectively etched by any selective wet or dry etch which can selectively etch silicon oxide over the spaced apart features 132 and over the material of filler features 142. For example, an HF isotropic wet etch can be used.

The pitch between features 132 and filler features 142 has doubled compared to the pitch between features 132 alone due to the removal of the oxide spacers. If desired, a portion of hard mask stack 126 can also be etched during the spacer removal. For example, if a DARC layer is present in the stack, then first portions of the DARC layer located under the spacers can also be removed during the spacer removal process to leave second portions of the DARC layer below the imagable material features 132 and filler features 142.

As shown in FIGS. 10A and 10B, at least one of hard mask stack 126 and/or device layers 118, 120, 122 and 124 are etched using features 132 and filler features 142 as a mask to form a plurality of pillar shaped devices 112. For example, features 132 and filler features 142 as well as any BARC layer material remaining under features 132 and filler features 142 can be removed after patterning the DARC layer of hard mask stack 126 using features 132 and filler features 142 as a mask. The DARC layer can be patterned (i.e., etched) during the same step as spacer 138 removal step. The patterned DARC layer can be trimmed after patterning to reduce the size of the remaining DARC layer patterns and to round the corners of the DARC layer patterns.

It should be noted that the BARC and DARC layers can be etched together using features 132 and filler features 142 as a mask or the BARC layer can be etched prior to the step of forming spacers 138, using features 132 as a mask, while the DARC layer can be etched using features 132 and filler features 142 as a mask.

The patterned DARC layer can then be used as a mask to pattern the remaining layers of hard mask stack 126, such as the APF, tungsten and TiN layers. The DARC layer can optionally be removed during and/or after patterning the remaining hard mask stack 126 layers. The remaining patterned hard mask stack 126 layers are then used as a mask to etch the device layers 118, 120, 122 and 124 to form a plurality of pillar shaped devices 112.

For example, each of the devices comprises the p-i-n diode in series with an antifuse dielectric, as described with respect to FIG. 1. Pillar shaped devices 112 have a pitch which can be double that of what the pitch would have been had only features 132 been used as mask.

The spaces between pillar devices 112 are filled with a gap fill insulating material, such as silicon oxide, to isolate devices 112 from each other. The gap fill insulating material can be planarized by CMP or etchback. Upper conductors or electrodes 26 can be formed over devices 112 by the subtractive or the Damascene processes described above with respect to FIG. 3 or 4. The tungsten and TiN layers of hard mask stack 126 can be retained in the final device as portions of upper electrodes 26. The APF layer can be removed after patterning the device layers.

Formation of a first memory level has been described. Additional memory levels can be formed above this first memory level to form a monolithic three dimensional memory array. In some embodiments, conductors can be shared between memory levels. That is, a top conductor would serve as the bottom conductor of the next memory level. In other embodiments, an interlevel dielectric (not shown) can be formed above the first memory level, its surface planarized, and construction of a second memory level begins on this planarized interlevel dielectric, with no shared conductors.

A monolithic three dimensional memory array can be one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy U.S. Pat. No. 5,915,167, "Three dimensional structure memory." The substrates can be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Throughout this description, one layer has been described as being "above" or "below" another. It will be understood that these terms describe the position of layers and elements relative to the substrate upon which they are formed, in most embodiments a monocrystalline silicon wafer substrate; one feature can be above another when it is farther from the wafer substrate, and below another when it is closer. Though clearly the wafer, or the die, can be rotated in any direction, the relative orientation of features on the wafer or die will not change. In addition, the drawings are purposefully not shown to scale and are merely representative of layers and processed layers.

The embodiments also relate generally to methods of making semiconductor devices, and more particularly, to methods of making semiconductor pillar structures. Devices made from semiconductor materials are used to create memory circuits in electrical components and systems. Memory circuits are the backbone of such devices as data and instruction sets are stored therein. Maximizing the number of pillar structures per unit area on such circuits minimizes their cost and thus can be a primary motivation in designing of such circuits.

The present embodiments use various methods for increasing the density of memory arrays that can be used with various semiconductor devices. For instance, the feature density of memory arrays can be increased by forming pillars in the spaces between the original pillars where conventional memory arrays just deposit filler materials. By using the spaces between the original pillars, the new pillars can increase the density of the memory arrays and improve the memory circuits used in various semiconductor devices.

The present embodiments also realize that a single hard mask can be made from a single material to construct these memory circuits and semiconductor devices. This can be a much simpler and more efficient process than conventional methods. Conventional methods use a variety of materials, layers, and steps to make such a hard mask. In contrast, the present embodiments can employ a single material to form both the original pillars and fill the spacer regions.

The pillars and filled spacer regions can then serve as a single hard mask. Once the hard mask is formed, the spacers can then be easily removed to expose the original pillars and filled spacer regions. The filled spacer regions can then be made into new pillars. The density of the memory array can then increased by having the original pillars combined with the new pillars formed from the filled spacer regions. Referring now to FIGS. 11A-11B, a first step in the process of creating the pillar devices is shown. FIG. 11A represents a side cross-sectional view of the device layers and FIG. 11B represents a top view of the same after the first step.

For example, one or more devices can be formed over one or more substrates 150 of the present embodiments. Any suitable substrate material can be used, such as a semiconductor wafer (including silicon or compound semiconductor wafers) or metal, silicon, a dielectric material, glass, ceramic or plastic. The substrates can then be covered by one or more other or additional layers. For instance, substrate 150 can comprise one or more insulating layers or devices. The device layers can comprise semiconductor layers, semiconductor devices, electrically conductive layers, layers which form electrodes, and/or insulating layers for isolation of the semiconductor or conductive portions of the devices.

At least two spaced apart features 156 can then be formed in a patterned or non-patterned first feature array 154 over substrate 150. The features can be formed directly or indirectly on or above the semiconductor, conductive and/or insulating or device layers.

Features 156 can comprise any shape as long at the features can subsequently function as an etching mask for etching the underlying device layers.

For example, as will be described in more detail below, features 156 can be cylindrical in shape. However, other shapes such as rectangular, triangular, oblong, square, can also be employed with the present embodiments. Features 156 can have any desired size, width, and length. In some embodiments, features 156 can have the same width as the underlying devices.

Features 156 should have sufficient height and width to be capable as serving as a portion or as an entire etching hard mask. In certain other embodiments, features 156 can comprise similar shapes, size, heights, widths and lengths. In still other embodiments, features 156 can comprise different shapes, sizes, heights, widths, and lengths.

Referring now to FIGS. 12A-12B, a second step in the process of creating the pillar devices is shown. FIG. 12A represents a side cross-sectional view of the device layers and FIG. 12B represents a top view of the same after the second step. Sidewall spacers 160 can then be formed on the features 156. Sidewall spacers 160 (see FIGS. 13A-13B) can be formed by conventional sidewall spacer formation methods, such as by depositing a film or first layer 158 over the features 156 and then anisotropically etching the film to leave sidewall spacers 160 and sidewall spacer regions 164 on features 156.

Sidewall spacers 160 can comprise a conductive, insulating, or semiconductor material different from that of the upper portions of features 156. In other embodiments sidewall spacers 160 can comprise silicon, nitride, silicon nitride or other similar type materials that can generally be etched or removed or easily etched or removed relative to carbon materials.

Referring now to FIGS. 13A-13B, a third step in the process of creating the pillar devices is shown. FIG. 13A represents a side cross-sectional view of the device layers and FIG. 13B represents a top view of the same after the third step. Sidewall spacer 160 material can be selected such that it can be selectively anisotropically etched with dry etch chemistry compared to material of the spaced apart features 156, and such that it can be selectively removed (such as isotropically etched) compared to the material of the spaced apart features 156 using a different dry or wet etch chemistry. For example, when the features comprise an imagable material, such as a photoresist material, sidewall spacers 160 can comprise silicon oxide, silicon nitride, silicon, or nitride. Other material combinations can also be employed.

Sidewall spacer regions 164 can be in any shape, depth, width or design. In many cases, they will be defined by sidewall spacers 160 and how they are oriented, shaped, designed, and positioned. Sidewall spacer regions 164 can be exposed to an optional etchant gas in an optional carrier gas. The optional etchant gas can comprise a gas or gas isotope selected from the group consisting of $H_2$, F, Cl, and Br. The optional carrier gas can comprise a gas or gas isotope selected from the group consisting of He, Ar, $H_2$, Kr, Xe, and $N_2$.

The optional etchant gas can be employed to prepare spacer regions 164 for filling using a "selective material." The etchant gas functions to limit the growth or deposition on sidewall spacers 160, and fill spacer regions 164. Other gases with similar functions can be employed with the present embodiments. The "selective material" that fills the spacer regions can then be used to later serve as filler features 190 (described in more detail below and shown in FIGS. 14A and 14B).

The "selective material" can be used to directionally fill spacer regions 164 or "gaps" in any desired direction. Generally, the directional fill can be from the bottom of the spacer region to the top of spacer region 164. However, this is not required. In certain embodiment the filling of spacer regions 164 can be described as "gap filling."

Subsequently, as discussed, spacer regions 164 located adjacent to sidewall spacers 160 can then be filled with a "selective material." The "selective material" in some embodiments can comprise a carbon material of the form $C_xH_y$, wherein x can be an odd or even number greater than 1, and y can be 2x. In other embodiments, the "selective material" can comprise a material selected from the group consisting of carbon, tungsten, silicon, and their associated isotopes.

Amorphous materials or mixtures of materials of carbon, tungsten, silicon, and their associated isotopes can be employed with the present embodiments. Other material or elements having similar properties to the above described materials or elements can also be employed with the present embodiments or teachings. Various processes can be used to construct the feature arrays. Table 1 shows an example of some parameters that can be employed when patterning features arrays with filler features 164 comprising a carbon material.

TABLE 1

Process Parameters for Feature Array Patterning

| PROCESS PARAMETER | RANGE |
| --- | --- |
| EMP (C.) | 300-650 |
| Precursor $C_xH_y$ | x = 2-4; y = 2-10 (include all the single, double and triple bonded CxHy species) |
| Inert carrier Gas/Precursor Ratio | He, Ar, $H_2$, Kr, Xe, $N_2$ etc |
| Etchant Gas/precursor Ratio | H2, F-containing gas |
| Carrier/Precursor Ratio | 0.5:1-100:1 |
| Chamber Pressure (Torr) | 1-10 |
| $1^{st}$ RF Power Frequency (MHz) | 10-50 |
| $2^{nd}$ RF Power Frequency (KHz) | 90-500 |
| 1st RF Power Density (W/in²) | 1.0-30 |
| 2nd RF Power Density to 1st RF Power Density | 0-0.6 |
| Electrode Spacing (Mils) | 200-1000 |

EXAMPLE 1

Carbon Single Bond and Triple Bond Example

Some examples of the present teaching are provided on Table 1 above. The conditions for carbon to carbon single bonds (C—C) are described. In general the deposition rates for these types of materials are fairly slow. In contrast the carbon to carbon (C≡C) triple bond can be very reactive and fills the gaps and spacer regions very quickly and are more difficult to control.

EXAMPLE 2

Carbon Double Bond Example

Carbon to carbon double bond (C═C) materials are both effective for growth and depositions and provide desirable material for directionally filling the spacer regions to form filler features. Examples of the conditions for deposition are provided in Table 1 above.

Referring now to FIGS. 14A-14B, a fourth step in the process of creating the pillar devices is shown. FIG. 14A represents a side cross-sectional view of the device layers and FIG. 14B represents a top view of the same after the first step. The "selective material" can be used to fill the sidewall spacer regions 164 to form a second layer 170. Second layer 170 can be applied as a film over and between sidewall spacers 160 and sidewall spacer regions 164.

The "selective material" in some embodiments can comprise the same material as features 156 or material with similar etch characteristics as features 156. The "selective material" should be different from the material of sidewall spacers 160 so that sidewall spacers 160 can be selectively etched and removed later on to form filler features 190.

Referring now to FIGS. 15A-15B, a fifth step in the process of creating the pillar devices is shown. FIG. 15A represents a side cross-sectional view of the device layers, and FIG. 15B represents a top view of the same after the fifth step. After filler features 190 are formed, a portion of second layer 170 covering sidewall spacers 160 can be removed. This can be accomplished using any technique known in the art. For instance, chemical mechanical polishing (CMP) is one technique that can be employed to expose sidewall spacer top portion 180. Other techniques and methods known in the art can be employed. This technique then exposes the top portion of features 156, sidewall spacers 160, and filler features 190 for further process steps.

Referring now to FIGS. 16A-16B, a sixth step in the process of creating the pillar devices is shown. FIG. 16A represents a side cross-sectional view of the device layers, and FIG. 16B represents a top view of the same after the sixth step. Next, sidewall spacers 160 can be selectively removed to form open spacer regions 196 (see FIG. 16B). The step of selectively removing can be accomplished using selective etching.

For instance, the material of sidewall spacers 160 can be selectively etched or removed while features 156 and filler features 190 act as a single hard mask. The hard mask and/or device layers can be etched using isotropic or anisotropic etching using spaced apart features 156 and filler features 190 as the mask. Optionally, prior to the step of etching the hard mask and/or device layers, filler features 190 can be reduced, trimmed, or size adjusted if desired. In certain embodiments when features 156 and filler features 190 comprise a carbon material, the resulting hard mask can be uniform and produce high quality second feature arrays 200.

Other techniques known in the art are also possible to remove sidewall spacers 160. The removal of sidewall spacers 160 leaves spaced apart features 156 and filler features 190 spaced apart from each other. A pattern or non-pattern second feature array 200 can then be formed that comprises features 156 and filler features 190. Second feature array 200 can comprise an array that has at least 2× the array density of first feature array 154.

The pattern arrays can be designed in two-dimensional or three-dimensional devices. In other embodiments any suitable devices can be formed. For instance, the devices can have a substantially cylindrical and/or substantially rectangular pillar shape, depending on the shape of features 156 and filler features 190. Non-pillar shaped devices can also be formed.

The devices can comprise diodes, transistors, resistors, antifuse dielectrics, fuses, resistivity-switching materials, capacitors, etc. Logic, volatile memory or nonvolatile memory devices or arrays can also be formed. Further, a plurality of pillar shaped devices which comprise a plurality of diodes containing nonvolatile memory cells can be formed. The details regarding these devices are provide elsewhere (e.g., Herner et al. U.S. Pat. No. 6,952,030, entitled "High density Three-dimensional Memory Cell," hereinafter incorporated by reference. This patent describes memory cells which can be formed by the methods of the present embodiments).

Formation of a first memory level has been described. Additional memory levels can be formed above this first memory level to form a monolithic two or three-dimensional memory arrays. In some embodiments, conductors can be shared between memory levels. That is, top conductor would serve as the bottom conductor of the next memory level. In other embodiments, an interlevel dielectric (not shown) can be formed above the first memory level, its surface planarized, and construction of a second memory level begins on this planarized interlevel dielectric, with no shared conductors.

A monolithic three-dimensional memory array can be one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy U.S. Pat. No. 5,915,167, "Three-dimensional Structure Memory." The substrates can be thinned or removed from the memory levels before bonding, but as the memory levels are initially formed over separate substrates, such memories are not true monolithic three-dimensional memory arrays.

A monolithic three-dimensional memory array formed above a substrate comprises at least a first memory level formed at a first height above the substrate and a second memory level formed at a second height different from the first height. Three, four, eight or indeed any number of memory levels can be formed above the substrate in such a multilevel array.

Other devices can be formed using the methods of the present teachings. For instance, a semiconductor device can be produced by a method for increasing pattern array density of pillars having sidewall spacers and spacer regions, comprising filling the spacer regions of the array pattern with a selective material, and removing the sidewall spacers of the array pattern pillars to form additional pillars in the spacer regions and increase the density of the pattern array of the semiconductor device.

The embodiments of the teachings have been described in an illustrative manner. It is to be understood that the terminology, which has been used, is intended to be in the nature of words of description rather than of limitation.

Many modifications and variations of the embodiments are possible in light of the above teachings. Therefore, within the scope of the appended claims, the embodiments can be practiced other than as specifically described.

The invention claimed is:

1. A method comprising:
   forming a plurality of completely distinct first features above a substrate;
   forming sidewall spacers on the first features;
   filling spaces between adjacent sidewall spacers with filler features; and
   removing the sidewall spacers.

2. The method of claim 1, wherein the substrate comprises a material selected from the group consisting of metal, a dielectric material, and silicon.

3. The method of claim 1, wherein forming sidewall spacers comprises depositing a first layer on the first features.

4. The method of claim 3, wherein the first layer comprises a nitride material.

5. The method of claim 1, wherein the filler features comprise a selective material.

6. The method of claim 5, wherein the selective material is applied using a directional gap fill technique.

7. The method of claim 5, further comprising applying a carrier gas to the sidewall spacers prior to applying the selective material.

8. The method of claim 7, wherein the carrier gas is selected from the group consisting of He, Ar, $H_2$, Kr, Xe, and $N_2$.

9. The method of claim 5, further comprising applying an etchant gas to the sidewall spacers prior to applying the selective material.

10. The method of claim 9, wherein the etchant gas comprises a gas selected from the group consisting of $H_2$, F, Cl, and Br.

11. The method of claim 5, wherein the selective material comprises a carbon material of the form $C_xH_y$, wherein x is an odd or even number greater than 1, and y is 2x.

12. The method of claim 5, wherein the selective material comprises a material selected from the group consisting of carbon, tungsten, and silicon, and their associated isotopes.

13. The method of claim 1, wherein the first features and the filler features comprise second features.

14. The method of claim 13, wherein the second features have at least twice the density of the first features.

15. The method of claim 13, wherein the first features comprise a pillar structure.

16. The method of claim 13, wherein the second features comprise a two-dimensional structure.

17. The method of claim 13, wherein the second features comprise a three-dimensional structure.

18. The method of claim 13, wherein the second features are patterned using a surface activation technique.

19. The method of claim 13, wherein the second features are patterned using plasma enhanced chemical vapor deposition (PECVD).

20. The method of claim 13, wherein the second features comprise carbon.

21. The method of claim 13, further comprising etching device layers above a substrate using the second features.

22. The method of claim 13, further comprising forming a memory device using the second features.

* * * * *